(12) United States Patent
Zeng et al.

(10) Patent No.: US 11,370,657 B2
(45) Date of Patent: Jun. 28, 2022

(54) METHOD AND APPARATUS FOR MANUFACTURING MICROFLUIDIC CHIP WITH FEMTOSECOND PLASMA GRATING

(71) Applicants: Chongqing Institute of East China Normal University, Chongqing (CN); ROI Optoelectronics Technology CO, LTD., Shanghai (CN); East China Normal University, Shanghai (CN)

(72) Inventors: Heping Zeng, Chongqing (CN); Junyi Nan, Chongqing (CN); Mengyun Hu, Chongqing (CN); Ming Yan, Chongqing (CN)

(73) Assignees: CHONGQING INSTITUTE OF EAST CHINA NORMAL UNIVERSITY, Chongqing (CN); ROI OPTOELECTRONICS TECHNOLOGY CO, LTD., Shanghai (CN); EAST CHINA NORMAL UNIVERSITY, Shanghai (CN)

( * ) Notice: Subject to any disclaimer, the term of this patent is extended or adjusted under 35 U.S.C. 154(b) by 82 days.

(21) Appl. No.: 17/230,237

(22) Filed: Apr. 14, 2021

(65) Prior Publication Data

US 2021/0323814 A1 Oct. 21, 2021

(30) Foreign Application Priority Data

Apr. 15, 2020 (CN) .......................... 202010294139.7

(51) Int. Cl.
*B81C 1/00* (2006.01)
*B23K 26/55* (2014.01)
(Continued)

(52) U.S. Cl.
CPC .......... *B81C 1/00071* (2013.01); *B23K 26/55* (2015.10); *B81C 1/00531* (2013.01);
(Continued)

(58) Field of Classification Search
CPC ........ G01J 3/26; G02B 26/001; B01L 3/5027; B23K 26/032; B23K 26/0643;
(Continued)

(56) References Cited

U.S. PATENT DOCUMENTS

| 2011/0136162 A1* | 6/2011 | Sun ................... B01L 3/502761 |
| | | 118/723 R |
| 2015/0110150 A1* | 4/2015 | Schmidt ............. G01N 21/1717 |
| | | 374/43 |
| 2020/0049689 A1* | 2/2020 | Maoz ................. G01N 33/4836 |

FOREIGN PATENT DOCUMENTS

| CN | 102513700 | 6/2012 |
| CN | 105652355 | 6/2016 |

OTHER PUBLICATIONS

CNIPA, First Office Action for CN Application No. 202010294139.7, dated Jun. 21, 2021.

* cited by examiner

*Primary Examiner* — Tarifur R Chowdhury
*Assistant Examiner* — Omar H Nixon
(74) *Attorney, Agent, or Firm* — Hodgson Russ LLP

(57) ABSTRACT

The present disclosure discloses a method and apparatus for manufacturing a microfluidic chip with a femtosecond plasma grating. The method is characterized in that two or more beams of femtosecond pulse laser act on quartz glass together at a certain included angle and converge in the quartz glass, and when pulses achieve synchronization in time domain, the two optical pulses interfere; Benefited by constraint of an interference field, only one optical filament is formed in one interference period; and numbers of optical filaments are arranged equidistantly in space to form the plasma grating. The apparatus for manufacturing the micro- (Continued)

fluidic chip includes a plasma grating optical path, a microchannel processing platform, and a hydrofluoric acid ultrasonic cell.

5 Claims, 4 Drawing Sheets

(51) Int. Cl.
*G01J 3/26* (2006.01)
*G02B 26/00* (2006.01)

(52) U.S. Cl.
CPC ............ *B81C 1/00539* (2013.01); *G01J 3/26* (2013.01); *G02B 26/001* (2013.01); *B81C 2201/0132* (2013.01); *B81C 2201/0133* (2013.01); *B81C 2201/0143* (2013.01); *B81C 2900/00* (2013.01)

(58) Field of Classification Search
CPC .......................... B23K 26/0648; B23K 26/55; B81C 1/00071; B81C 1/00531; B81C 1/00539; B81C 2201/0132; B81C 2201/0133; B81C 2201/0143; B81C 2900/00
USPC ......................................................... 356/578
See application file for complete search history.

METHOD AND APPARATUS FOR MANUFACTURING MICROFLUIDIC CHIP WITH FEMTOSECOND PLASMA GRATING

CROSS-REFERENCE TO RELATED APPLICATIONS

This application claims priority to Chinese Patent Application Serial No. 202010294139.7, filed on Apr. 15, 2020, the entire contents of which are incorporated by reference herein.

FIELD

The present disclosure relates to the field of microchannel chip manufacturing, and more particularly, to a method and apparatus for manufacturing a microfluidic chip with a femtosecond plasma grating.

BACKGROUND

Microfluidic chips based on the microfluidic technology can integrate functions such as sample collection, transfer, dilution, reaction, separation, and detection on tiny-scale materials, which not only provides fast reaction speed, but also greatly reduces the consumption of samples and reagents in biochemical experiments, and therefore are widely used in medicine, biology, chemistry, materials, and crossing fields thereof. The structure of microchannels in the microfluidic chip is individually designed according to application requirements and consists of various independent microchannels and conduits between the microchannels. With the development of the microfluidic technology, highly integrated and highly automated microfluidic chips are becoming increasingly important in biochemical reaction experiments.

At present, the manufacturing methods of microchannel chips include injection molding, hot pressing, ultraviolet exposure plus acid etching, laser ablation and the like. These manufacturing methods are used to manufacture microchannels on a plane basically in accordance with the classic "top-down" and "bottom-up" preparation. Complex microchannel structures, for example, three-dimensional units, are difficult to manufacture by the above-mentioned manufacturing techniques. Femtosecond pulse laser having a femtosecond time-domain pulse width and extremely high peak power can be used to process materials with high hardness and high melting points and ablate three-dimensional microstructures in transparent media such as glass. The femtosecond pulse laser has characteristics such as threshold damage and multiphoton processes in transparent media, and therefore, the femtosecond pulse laser technology has received extensive attention and research in the field of preparation and processing of high-precision and submicron-scale microstructures. The search group of Gong Qihuang at Peking University has reported the use of femtosecond laser combined with a water-assisted method to prepare microchannels and microgrooves in quartz glass. In the research, a single laser beam was used for ablation point by point, with a spot ablation diameter of about 1.5 micrometers and a step length of about 1 micrometer for each processing, and it takes only one hour to complete the processing of a microchannel with 75 micrometers in length, 75 micrometers in width, and 50 micrometers in depth.

Chinese patent document CN 101101356A describes that microfluidic optical waveguides can be efficiently processed on quartz glass substrates using the femtosecond laser, but the method causes sputtered particles to be easily attached to an objective lens during processing, which leads to reduction in processing efficiency, and there is a certain randomness in the shape regularity of grooves. A method for processing embedded microfluidic heat dissipation channels inside optical components is proposed in Chinese patent document CN 109597179A, and this method uses a single beam of femtosecond laser to etch periodically and densely arranged microchannels inside the component, which can improve the heat dissipation performance. The denser the microchannels are, the better the heat dissipation effect will be, and the path that the laser needs to travel during etching will become longer, resulting in increasement of processing time.

In summary, though the femtosecond laser processing methods have advantages in manufacturing microscale or nanoscale and precision microchannel structures, but there still have the problems of slow processing speed, big time consumption, short focal depth for the ablation of three-dimensional structures, and difficulties in manufacturing millimeter-sized microchannels. Moreover, when the femtosecond pulse laser propagates in the quartz glass, there is very high peak power intensity near its focal point area of the focusing lens, which introduces a nonlinear Kerr effect and self-focusing effect in the quartz glass medium. When the self-focusing effect and a plasma self-defocusing effect generated by ionization are balanced, the diameter of a light spot remains almost unchanged in the propagation, and a long white optical filament can be seen in the quartz glass. When the laser energy is further increased, it can be observed that the number of optical filaments gradually increases, and the distribution of the optical filaments is irregular. The "thickening" of the diameter and the irregular distribution of the optical filaments are not conducive to the precision processing of the femtosecond laser.

SUMMARY

A method for manufacturing a microfluidic chip with a femtosecond plasma grating is provided. In this method, two or more beams of femtosecond pulse laser converge in quartz glass at a certain included angle, and interference occurs when pulses are synchronized in time domain; a plurality of optical filaments are formed and arranged equidistantly in space; a plasma is controlled to scan and ablate a shape of a microchannel in the quartz glass by adjusting a focal length of a focusing lens and laser energy; and an ablated part of the quartz glass is immersed in hydrofluoric acid to form a microchannel structure; and the microfluidic chip made of the quartz glass is obtained.

DETAILED DESCRIPTION

Figure 1:
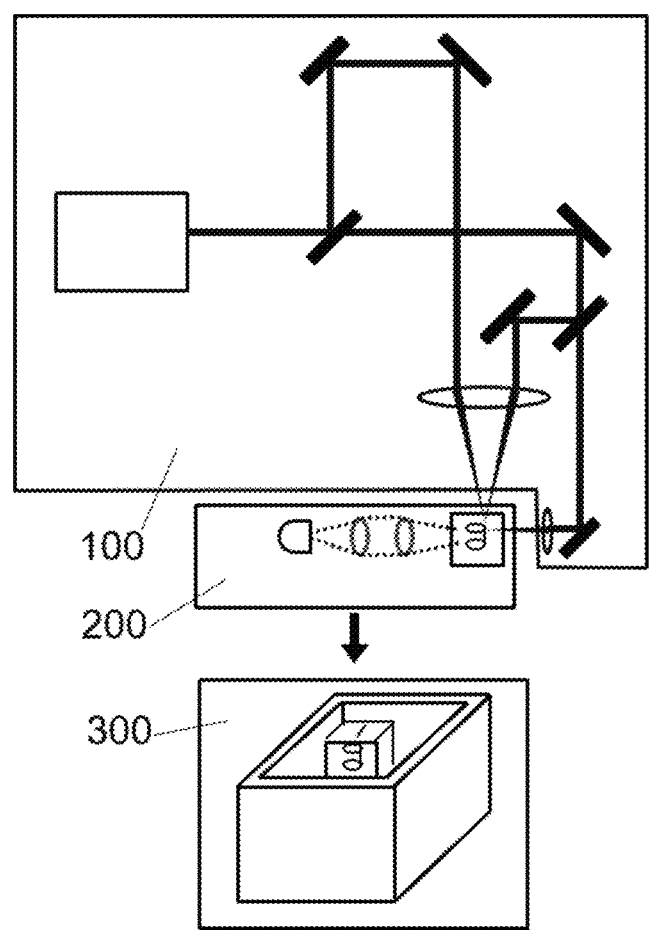
FIG. 1 is a structural schematic diagram of an apparatus for manufacturing a microfluidic chip with a plasma grating.

An objective of the present disclosure is to design a method and apparatus for manufacturing a microfluidic chip with a femtosecond plasma grating in view of the shortcomings of the related area. Two or more beams of femtosecond pulse laser irradiate on quartz glass together at a certain included angle and are focused in the quartz glass and the time-domain synchronized pulses are interfered near the focus point area. Benefited by the constraint of an interference field, only one optical filament is formed in one interference period; and numbers of optical filaments are arranged equidistantly in space to form a plasma grating. The plasma grating has a regular distribution of optical filaments under high laser power, and the length, interval, and number of the optical filaments can be easily adjusted. By utilizing the characteristics of the plasma grating in the quartz glass, the manufacturing speed of quartz glass microfluidic chips can be greatly raised, the roughness quality of a microchannel wall surface can be improved, which is especially convenient for processing the microfluidic chip of a three-dimensional structure, and provides a new preparation method for manufacturing of microchannel chips, along with unique advantages especially in processing the microfluidic chip with the ultrafast optical technology.

The specific technical solution to achieve the objective of the present disclosure is as follows: the method for manufacturing the microfluidic chip with the femtosecond plasma grating is characterized in that the two or more beams of femtosecond pulse converge in quartz glass at a certain included angle, and interference occurs when the pulses are synchronized in the time domain; numbers of optical filaments arranged at equal intervals in space are formed; the plasma is controlled to quickly scan in the quartz glass and ablate the shape of a microchannel by adjusting the focal length of a focusing lens, laser energy, and the movement of quartz glass; and the ablated part of the quartz glass is soaked in hydrofluoric acid to form the microchannel structure of the microfluidic chip.

The apparatus for manufacturing the microfluidic chip with the femtosecond plasma grating is characterized by including a plasma grating optical path, a microchannel processing platform and a hydrofluoric acid ultrasonic cell. The two or more beams of femtosecond pulse laser pass through a convex lens, then converge and are synchronized in the quartz glass, and create interference between photoelectric fields and form the plasma grating; a three-dimensional electronically controlled displacement platform of the microchannel processing platform drives the quartz glass to move, so that the path of the plasma grating ablates the shape of the microchannel; the shape of the plasma grating is monitored and imaged by CCD cameras in the processing process; the ablated quartz glass is placed in the hydrofluoric acid ultrasonic cell containing a dilute hydrofluoric acid solution; and the part ablated by the laser in the quartz glass is immersed and etched to form the microchannel.

The femtosecond pulse laser output from a femtosecond pulse laser in the plasma grating optical path is split into two or more laser beams with similar optical power by an optical splitter; the separated laser beams transport through a time domain delay controller, then transport through the converging lens, and converge together in the quartz glass; all the laser beams coincide near the focal points; and there is a certain included angle between the incident laser beams. When the various laser beams are synchronized in the time domain, the interference occurs in the quartz glass, and the plasma grating is formed. A diaphragm is placed between the converging lens and the focal point of the laser beam and is used to constrain the diameter of the laser beam.

The imaging devices for observing the shape of the plasma grating at the focal point and simultaneously monitoring the process of the laser processing the microchannel are constructed on the microchannel processing platform in two orthogonal directions of the cross section of the optical axis. A first convex lens is placed on the cross section of the optical axis, and the position of the focal point of the first convex lens coincides with the position of the plasma grating. At this time, the image of the plasma grating is enlarged after passing through the first convex lens, and then converges by a second convex lens placed behind the first convex lens. The first CCD camera is placed at the focal point of the second convex lens, and the data line of the first CCD camera is connected to the computer. Similarly, a third convex lens, a fourth convex lens and the second CCD camera are placed in the orthogonal direction of the imaging system in the same way, and the data line of the second CCD camera is connected to the computer, so that the shape and machining process of the plasma grating can be observed in real time on the computer. Then, the quartz glass is placed at the focal point of the converging lens, and the imaging device is used to observe the shape of the plasma grating in the quartz glass in real time. The quartz glass is fixed on the three-dimensional electronically controlled displacement platform. According to the structure design of the microchannel, the length and the number of the optical filaments in the plasma grating are adjusted, and the three-dimensional displacement platform is cooperatively controlled, so that the shape of the microchannel is ablated in the quartz glass, and several straight lines are ablated between the microchannel in the quartz glass and the surface of the quartz glass.

The hydrofluoric acid solution in the hydrofluoric acid ultrasonic cell penetrates from the surface of the quartz glass into the area ablated by the femtosecond laser, and the rate of the hydrofluoric acid solution corroding the ablated area is much greater than the rate of the hydrofluoric acid solution corroding an unablated area. The quartz glass ablated by the laser is placed in the ultrasonic cell containing the dilute hydrofluoric acid solution, and after a period of time, the area ablated by the laser is corroded, and the microchannel chip can be obtained.

The femtosecond pulse laser includes a pulse time-domain shaping module. By setting time-domain pulse shaping parameters, the femtosecond pulse laser can finally output a Gaussian distributed pulse laser, a rectangular distributed pulse laser, a semicircular distributed pulse laser, and a triangular distributed pulse laser or a raised cosine distributed pulse laser; and the pulse lasers distributed in different time domains can be used to produce plasma optical filaments distributed in different spaces. The optical splitter may be one or more planar beam splitters, a combination of a half-wavelength wave plate and a polarization beam splitter, or a microarray mirror.

The two femtosecond pulse lasers of the plasma grating create interference in the quartz glass, and a series of equally spaced optical filaments are formed in the quartz glass; the interference may be the interference of the two femtosecond pulse lasers in the quartz glass, or the interference of the more femtosecond pulse lasers in the quartz glass; and the interference of the more femtosecond pulse lasers may be the interference of the three lasers or the interference of more than three lasers. The interaction among the three lasers is as follows: the three lasers are in the same plane, and the center wavelengths of two of the three femtosecond pulse lasers are the same, after the femtosecond pulse lasers are synchronized in the time domain, the two femtosecond pulse lasers pass through the converging lens and overlap at the focal point at a certain included angle, the interference occurs, and the plasma grating is formed; when the center wavelength of the third femtosecond pulse laser is different from the center wavelengths of the other two femtosecond pulse lasers, the third laser passes through the converging lens and overlaps with the plasma grating at the focal point, and after the third femtosecond pulse laser is synchronized with the other two femtosecond pulse lasers in the time domain, the third femtosecond pulse laser is incident at the Bragg angle of the plasma grating or other angles; or when the center wavelength of the third femtosecond pulse laser is the same as the center wavelengths of the other two femtosecond pulse lasers, the third laser passes through the converging lens and overlaps with the plasma grating at the focal point, and after the third femtosecond pulse laser is synchronized with the other two femtosecond pulse lasers, the third femtosecond pulse laser is incident at a nearly orthogonal angle of the plasma grating. The third optical beam is separated from the optical splitter, and the center wavelength of the third optical beam is the fundamental frequency laser, the second harmonic or the higher harmonic. A relatively strong plasma spot is produced at the overlap of the third laser beam and the plasma grating, and can cause local micro-explosion, which is beneficial to the processing of the microchannel, and has the advantage of controlling the local processing and positioning processing in the quartz glass. In addition, when the period of the formed plasma grating is in the submicron order, a local strong plasma is generated in a nanoscale space by combining the interaction of the third laser and a single optical filament or a few optical filaments in the plasma grating, and can be used for nanoscale microchannel processing. The third laser beam is used to increase the plasma density in the plasma grating, causes the splitting of local optical filaments in the plasma grating, and is used to process a plurality of cascaded channels. When the Kerr self-focusing effect, the plasma self-defocusing effect and the photoelectric field interference effect in the formation of plasma optical filaments are balanced, the optical filaments in the plasma grating do not split. The power of the two lasers which form the plasma grating is properly adjusted, so that the density of plasmas in the optical filaments generated by the lasers is slightly lower than the intensity which causes the optical filaments to split. At this time, when the third laser beam interacts with the unsplit optical filaments in the plasma grating, the local plasma density is enhanced, so that the maintenance condition of the single optical filament is destroyed, and the single optical filament is naturally split into two optical filaments at the place where the plasma density is strong. In this way, a cascaded two-way microchannel can be processed from the microchannel of the single optical filament. The third laser interacts with the plurality of optical filaments in the plasma grating; the split angle of the optical filament is increased by adjusting the power of the laser; and as the split optical filaments propagate, the split optical filaments are combined with the adjacent optical filaments. The connection design between the adjacent microchannels can be realized by using this technology to process the microchannels. A controllable optical processing technology is provided for high-precision and integrated microchannel processing.

The converging lens is a circular lens, a plano-convex cylindrical lens, a microlens array or a conical lens; the circular lens forms a cylindrical plasma grating in the quartz glass; the plano-convex cylindrical lens forms a plane plasma grating parallel to the optical axis in the quartz glass; the microlens array can form a three-dimensional plasma grating by using the interference of a plurality of femtosecond pulse lasers in the quartz glass; and when the conical lens is used to manufacture the microfluidic chip, the right converging lens can be selected according to the design of the microchannel.

The time domain delay controller includes two planar mirrors and a displacement platform, and is used to control the optical path difference between a reflected laser beam and a transmitted laser beam. The CCD camera is used to observe the length of the optical filaments, the interval between the optical filaments and the number of the optical filaments in the plasma grating, and can also be used to monitor the process of femtosecond laser processing. The length of the optical filaments in the plasma grating can be arbitrarily adjusted according to the optical power and the focal length of the focusing lens, and ranges from micrometers to centimeters. The interval between the optical filaments in the plasma grating can be controlled by changing the wavelength of the femtosecond pulse laser and the included angle between the interference lasers, and ranges from hundred nanometers to micrometers. The diaphragm is rectangular, circular or in other shapes, and is used to constrain the size of a passing light spot and finally indirectly control the number and distribution of the optical filaments in the plasma grating. The microchannel structure may be designed on the surface of the quartz glass, may also be designed inside the quartz glass, or may be three-dimensionally distributed. The dilute hydrofluoric acid solution is used to corrode the path ablated by the laser on the quartz glass to obtain the microchannel.

Compared with the related art, the present disclosure has the following advantages:

(1) During traditional femtosecond laser processing, due to the influence of the convergence of a microscope objective, the Rayleigh length of the light spot is only a few micrometers, and the ablation depth along the optical axis is only a few microns. The length of the optical filament of the plasma grating can be several centimeters, and can be arbitrarily adjusted according to the optical power and the focal length of the focusing lens; the ablation length along the optical axis is prolonged; and the production time of the microchannel in the quartz glass can be greatly reduced.

(2) The microfluidic chip can be processed under high laser power. In traditional optical processing methods, due to the nonlinear self-focusing effect and self-defocusing effect, when the laser power is high, a plurality of discontinuous focal points may appear in the quartz glass along the optical axis, which is harmful to the precise processing of the microfluidic chip. According to the present disclosure, when the laser power is high, a plurality of discontinuous focal points do not appear, and the laser energy is mainly constrained to propagate in the optical filaments, and when the provided laser power provided is higher, the moving speed of the electronically controlled displacement platform in the production process can be increased, and the production time of the microchannel in the quartz glass is further reduced.

(3) The coordinated processing of the plurality of optical filaments in the plasma grating is faster than the single laser beam processing. For example, the plasma grating including N plasma optical filaments is formed in the quartz glass, and the optical filaments are evenly spaced apart from each other and the distance is D (D ranges from hundred nanometers to hundred micrometers). At this time, the motor only needs to move by D in the direction parallel to the grating to complete the single ablation with a length of N×D, and the efficiency of the plurality of optical filaments is N times that of the single beam scanning.

(4) The microchannel array can be processed with high efficiency. The plasma grating consists of the N optical filaments with the equal intervals of d, and all the optical filaments are in the same plane. Only by controlling the movement of the quartz glass according to the design specification of one microchannel, the N microchannels can be ablated in the quartz glass to form the microchannel array.

(5) The present disclosure is suitable for processing three-dimensional microchannel structures. In traditional femtosecond laser processing, a microscopic objective lens focusing method is adopted. In the process of processing in the quartz glass, there is a limitation of short focal depth due to the influence of the focal length. The focal length of the cylindrical lens is larger than that of the microscope objective lens, so that on the one hand, the microchannel can be processed in a deeper place of the quartz glass, and on the other hand, the interference of the two lasers has a restrictive effect on the formation of the optical filaments. As the focal depth changes, no disorder multi-filament phenomenon appears, the shape of the plasma grating is still maintained, and through dispersion pre-management, the dispersion walk-off of the femtosecond laser in the quartz glass can be offset, and thus, the influence of the thickness of the quartz glass on the optical filament length is eliminated. Therefore, the plasma grating can be used to process the microchannels at different depths in the quartz glass, which is suitable for the manufacturing of the three-dimensional microchannel structures.

(6) The energy density of the plasma grating is higher than that of the single optical filament, and the ablation effect can be formed on the surface or inside of the quartz glass with low optical power. The plasma grating is formed by the coherent superposition of the two lasers, and the electric field intensity at the coherent combination is 4 times that of the single laser.

(7) The interaction of the three lasers can promote the processing effect of the plasma grating and control the local processing. The two femtosecond pulse lasers with the same central wavelength pass through the converging lens, and create the interference at the focal point, and multiphoton ionization occurs, and thus, the plasma grating is formed. When the third femtosecond pulse laser which is in the same plane with the two lasers is synchronized with the two lasers in the time domain, the third femtosecond pulse laser also passes through the converging lens, and is coupled into the plasma channel with the plasma grating at a certain included angle at the focal point, and no interference occurs. The third femtosecond pulse laser also forms optical filaments at the focal point, and the intensity of the laser electric field in the optical filaments reaches more than $10^{13}$ W/cm$^2$. Such a strong laser electric field drives free electrons in the plasma grating channel to obtain greater electronic kinetic energy, and thus, hot electrons are formed. When the plasma grating is formed in the air, the hot electrons accelerated by the laser electric field bombards nitrogen molecules in the Rydberg state in the plasma channel, which causes collision ionization, and greatly increases the electron concentration in the plasma channel; and high temperature and high pressure plasmas are more beneficial to the processing of the surface of the quartz glass; when the plasma grating is formed in the quartz glass, the electrons gaining kinetic energy in the plasma channel bombard Si—O bonds to promote the rupture of covalent bonds; the shock wave formed by the plasma with higher electron density is stronger, and can squeeze materials around the optical filaments to make the materials denser, which is beneficial to the corrosion of hydrofluoric acid and promotes the processing effect of the plasma grating. In addition, the relatively strong plasma spot is generated at the overlap of the three lasers by reasonably adjusting the power of the plasma grating and the power of the third laser; and the stronger plasma spot can cause local micro-explosion, which is beneficial to the processing of the microchannel and has the advantage of controlling the local processing in the quartz glass.

(8) The interaction of the three lasers can control the splitting and combination of the local optical filaments in the plasma grating; and the processing of a plurality of cascaded channels and connecting adjacent microchannels are realized in an optically controllable manner. The function of the third laser is to enhance the density of the plasmas in the plasma grating and cause the splitting of local optical filaments in the plasma grating, and the third laser is used to process the plurality of cascaded channels. When the Kerr self-focusing effect, the plasma self-defocusing effect and the photoelectric field interference effect in the formation of plasma optical filaments are balanced, the optical filaments in the plasma grating do not split. The power of the two lasers forming the plasma grating is properly adjusted, so that the density of the plasmas in the optical filaments generated by the lasers is slightly lower than the intensity which causes the optical filaments to split; at this time, when the third laser interacts with the unsplit optical filaments in the plasma grating, the local plasma density is enhanced, so that the maintenance condition of the single optical filament is destroyed, and the single optical filament is naturally split into two optical filaments at the place where the plasma density is strong. In this way, the cascaded two-way microchannel can be processed from the microchannel of the single optical filament. The third laser interacts with the plurality of optical filaments in the plasma grating; the splitting angle of the optical filaments is increased by adjusting the power of the laser; and as the split optical filaments propagate, the split optical filaments are combined with the adjacent optical filaments. The connection design between the adjacent microchannels can be realized by using this technology to process the microchannels. The controllable optical processing technology is provided for high-precision and integrated microchannel processing.

(9) The processing precision of the plasma grating is high. The diameter of the optical filament in the plasma grating is about 1 micron, and the ablation diameter is small. In traditional femtosecond laser processing, the Rayleigh length of the laser beam is only a few microns. In comparison with the Rayleigh length of the laser beam, the Rayleigh length of the optical filament in the plasma grating is longer; the formed ablation structure has a high aspect ratio of 2 to 3 orders of magnitude, which is much higher than the high aspect ratio of the ablation structure formed by the traditional femtosecond laser processing method; and the catheter between the microchannels in the quartz glass is processed by using this characteristic, and the efficiency is extremely high.

(10) When the plasma grating is used for the ablation processing of the microchannel on the surface of a sample to be processed, the surface after ablation has better flatness and more regular lines than the surface ablated by the single laser beam. After the sample is washed by the hydrofluoric acid, the wall surface is smoother. When the femtosecond laser is used for ablation, many tiny particles are sputtered out during the ablation process of the laser and are attached to the periphery of the laser processing path. The tiny particles make the surface of the sample rough. When the laser passes through the surface with particles, the particles scatter part of the energy of the laser, which causes the reduction of the processing efficiency. Compared with the case of single laser processing, when the two lasers create the interference, the electric field intensity is 4 times that of the single laser, the sputtered particles produced are smaller in size, and the small sputtered particles are more uniformly and regularly distributed on the surface of the sample under the constraint of the photoelectric field. Therefore, the use of plasma grating processing is beneficial to improving the processing efficiency and improving the quality of the sample surface during processing.

Referring to FIG. 1, an apparatus for manufacturing a microfluidic chip with a femtosecond plasma grating according to the present disclosure includes a plasma grating optical path 100, a microchannel processing platform 200, and a hydrofluoric acid ultrasonic cell 300. The plasma grating optical path 100 includes a femtosecond pulse laser 101, a planar beam splitter 102 with 30% of reflectivity and 70% of transmittance, a one-to-one planar beam splitter 123, a first reflected laser beam 103, a second reflected laser beam 122, a transmitted laser beam 104, first to twelfth planar mirrors (105, 106, 107, 108, 109, 110, 111, 124, 117, 118, 119, 120), a first displacement platform 112, a second displacement platform 121, a first plano-convex cylindrical lens 113, a second plano-convex cylindrical lens 115, a first rectangular diaphragm 114, a second rectangular diaphragm 116 and a plano-convex circular lens 121; the microchannel processing platform includes quartz glass 201, a three-dimensional electronically controlled displacement platform 208, a first convex lens 202, a second convex lens 203, a third convex lens 205, a fourth convex lens 206, a first CCD camera 204 and a second CCD camera 207.

The present disclosure will be described in detail below with specific embodiments of manufacturing the microfluidic chip by the femtosecond plasma grating.

Embodiment I

Figure 2:
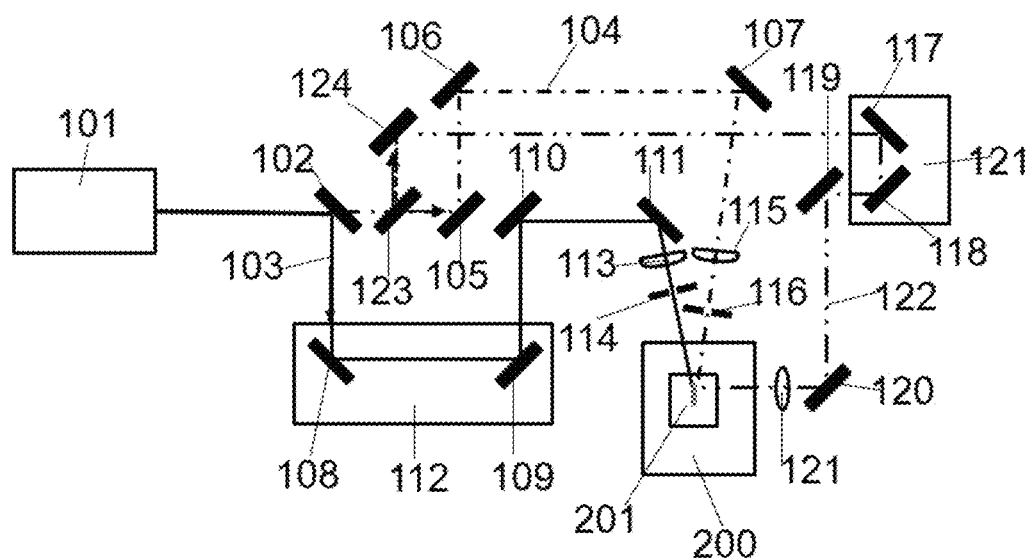
FIG. 2 is a structural schematic diagram of a plasma grating optical path and a microchannel processing platform.

Referring to FIG. 2, the femtosecond pulse laser output from the femtosecond pulse laser 101 in the plasma grating optical path 100 passes through the planar beam splitter 102 with 30% of reflectivity and 70% of transmittance, and the one-to-one spitting ratio planar beam splitter 123, then is split into the first reflected laser beam 103 with 30% power, the second reflected laser beam 122 with 35% power, and the transmitted laser beam 104 with 35% power. A first time domain delay controller includes the fourth planar mirror 108, the fifth planar mirror 109 and the displacement platform 112. A second time domain delay controller includes the ninth planar mirror 117, the tenth planar mirror 118 and the displacement platform 121. After the first reflected laser beam 103 passes through the first time domain delay controller, the optical path is changed through the sixth planar mirror 110 and the seventh planar mirror 111, and after the first reflected laser beam 103 passes through the first plano-convex cylindrical lens 113 and the first rectangular diaphragm 114, the first reflected laser beam converges in the quartz glass 201. After the optical path of the transmitted laser beam 104 is changed through the first planar mirror 105, the second planar mirror 106 and the third planar mirror 107, the transmitted laser beam 104 passes through the second plano-convex cylindrical lens 115 and the second rectangular diaphragm 116, and then converges in the quartz glass. The focal points of the two laser beams coincide in the quartz glass 201. The position of the displacement platform 112 is changed, so that the time domain interval between the first reflected laser beam 103 and the transmitted laser beam 104 is zero, and then the two pulses achieve the effect of synchronous interference at the converging point in the quartz glass 201.

The second reflected laser beam 122 is incident on the second time domain delay controller after passing through the planar mirror 124, then the light propagation path of the second reflected laser beam 122 is changed through the eleventh planar mirror 119 and the twelfth planar mirror 120, and the second reflected laser beam 122 converges by the plano-convex circular lens 121 and is incident in the quartz glass 201 to form a plasma optical filament. The plasma optical filament is orthogonal to the plasma grating and overlaps with the plasma grating in the same plane. The second displacement platform 121 is moved to synchronize the second reflected laser beam 122 and the first reflected laser beam 103 in the time domain. The plasma optical filament formed by the second reflected laser beam 122 interacts with the plasma grating formed by the interference of the first reflected laser beam 103 and the transmitted laser beam 104, which can accelerate electrons in the plasma grating channel, enhance the electron density of the plasma grating, and form the plasma grating with higher temperature and high density.

The included angle between the first reflected laser beam 103 and the transmitted laser beam 104 is theta. When the two laser beams are synchronized in the time domain, according to the interference principle, the periodic constant of the formed interference fringe satisfies the formula $D=\lambda/\sin(\theta/2)$. When the two laser beams are synchronized and the laser power density reaches above the ionization threshold, the plasma grating can be formed in the quartz glass 201.

Figure 3:
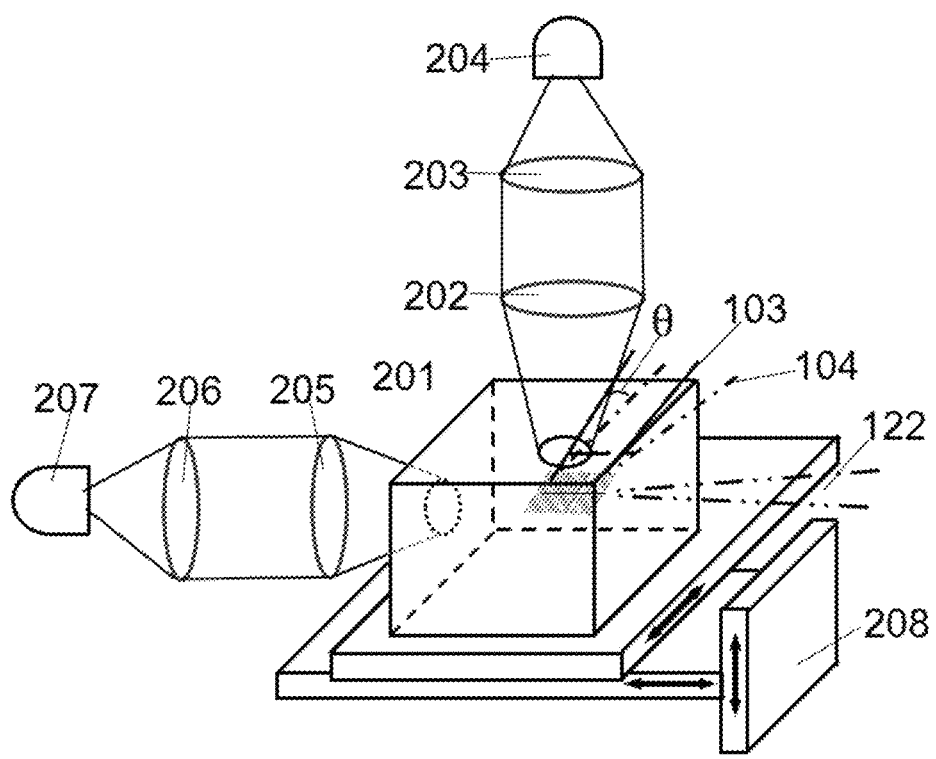
FIG. 3 is a structural schematic diagram of an imaging system.

Referring to FIG. 3, imaging devices are arranged in two orthogonal directions of the cross-section of the optical axis, the optical axis direction is perpendicular to the page, that is, the imaging devices are used to observe the shape of the plasma grating at the focal point and meanwhile monitoring the process of the laser processing the microchannel in the horizontal and vertical directions of the page. A telescope system formed by combining the first convex lens 202 and the second convex lens 203 is placed in the vertical direction. The focal point positions of the first convex lens 202 coincide with the position of the plasma grating. At this time, the image of the plasmon grating is enlarged after passing through the first convex lens 202, and then converges by the second convex lens 203 behind the first convex lens 202. The first CCD camera 204 is placed at the focal point of the second convex lens 203. The first CCD camera 204 is connected to a computer by a data line. In the horizontal direction of the page, the third convex lens 205, the fourth convex lens 206, and the second CCD camera 207 connected to the computer are placed in the same manner, so that the shape of the plasma grating and the processing process can be observed on the computer in real time. Then, the quartz glass 201 is placed at the focal point of the first plano-convex cylindrical lens 113 and the second plano-convex cylindrical lens 115, and the shape of the plasma grating in the quartz glass can be observed in real time by using the imaging devices. The quartz glass 201 is fixed on the three-dimensional electronically controlled displacement platform 208. According to the structure design of the microchannel, the length and the number of the optical filaments in the plasma grating are adjusted, and the three-dimensional electronically controlled displacement platform 208 is coordinately controlled, so that the shape of the microchannel is ablated in the quartz glass 201, and several straight lines are ablated between the microchannel in the quartz glass 201 and the surface of the quartz glass. The quartz glass 201 ablated by the laser is placed in the hydrofluoric acid ultrasonic cell 300; a hydrofluoric acid solution infiltrates into the quartz glass 201 by ultrasound to corrode the path ablated by the femtosecond laser; and as the rate of the hydrofluoric acid solution corroding the ablated area is much greater than the rate of the hydrofluoric acid solution corroding an unablated area, the area ablated by the laser is corroded in the hydrofluoric acid ultrasonic cell, and the microchannel chip made of the quartz glass can be obtained.

Figure 4:
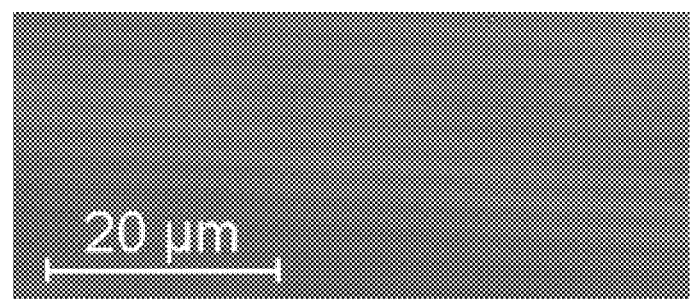
FIG. 4 is a schematic diagram of the plasma grating photographed by a CCD camera.

Referring to FIG. 4, the interval D between gratings in the plasma grating prepared above is about 2.3 micrometers, and the diameter of the optical filament is about 1.1 micrometers. The first rectangular diaphragm 114 and the second rectangular diaphragm 116 are used to constrain the diameter of the laser beam and can change the number of the optical filaments in the plasma grating.

Figure 5:
FIG. 5 is a schematic diagram illustrating splitting and combination of local optical filaments.

Referring to FIG. 5, with the increase of the optical power of the plasma grating prepared above, when the plasma density is high, the local optical filaments are split into two optical filaments, and then as the split optical filaments propagate, the adjacent optical filaments are combined, and according to this feature, the connection between the adjacent microchannels can be controlled in the process of processing in a light-controlled manner.

The above embodiments merely further elaborate the present disclosure and are not intended to limit the present disclosure. Any equivalent implementations of the present disclosure should be included in the scope defined the claims of the present disclosure.

What is claimed is:

1. An apparatus for manufacturing a microfluidic chip with a femtosecond plasma grating, wherein the apparatus comprises a plasma grating optical path, a microchannel processing platform, and a hydrofluoric acid ultrasonic cell;

the plasma grating optical path comprises a femtosecond pulse laser, an optical splitter, a first time domain delay controller, a second time domain delay controller, a first reflected laser beam, a second reflected laser beam, a transmitted laser beam, a first displacement platform, a second displacement platform, a first plano-convex cylindrical lens, a second plano-convex cylindrical lens, a first diaphragm, a second diaphragm, a plano-convex circular lens, and a plurality of planar mirrors;

the microchannel processing platform comprises quartz glass, a three-dimensional electronically controlled displacement platform, a first convex lens, a second convex lens, a third convex lens, a fourth convex lens, a first CCD camera, and a second CCD camera;

the optical splitter is configured as a combination of a half-wavelength wave plate and a polarization beam splitter, or as a microarray mirror, a single planar beam splitter, or a plurality of planar beam splitters;

the first time domain delay controller comprises a fourth planar mirror, a fifth planar mirror, and the first displacement platform, and is configured to control an optical path difference between the reflected laser beam and the transmitted laser beam;

the second time domain delay controller comprises a ninth planar mirror, a tenth planar mirror and the second displacement platform, and is configured to control an optical path difference between the reflected laser beam and the transmitted laser beam; and the first and second diaphragms are rectangular or circular, and configured to constrain a size of a light spot passing through the diaphragms and control a number and distribution of optical filaments in the plasma grating.

2. The apparatus according to claim 1, wherein femtosecond pulse laser output from the femtosecond pulse laser in the plasma grating optical path is split into two or more laser beams with similar power after passing through the optical splitter; the split laser beams each pass through a converging lens after passing through the time domain delay controllers, and converge together in the quartz glass, with focal points of the laser beams coinciding in the quartz glass and a certain included angle between incident laser beams; when the laser beams are synchronized in the time domain, interference occurs in the quartz glass, and a series of equally spaced optical filaments are formed in the quartz glass; one diaphragm is placed between the converging lens and the focal point of each laser beam and configured to constrain a diameter of the laser beam; and the femtosecond pulse laser comprises a pulse time-domain shaping module; the femtosecond pulse laser is configured to output Gaussian-distributed pulse laser, rectangularly-distributed pulse laser, semi-circularly-distributed pulse laser, triangularly-distributed pulse laser or raised cosine-distributed pulse laser by setting time-domain pulse shaping parameters, and generate plasma optical filaments distributed in different spaces by using pulse laser distributed in different time domains; a length of the plasma optical filament is adjusted by the optical power and a focal length of a focusing lens, and ranges from micrometers to centimeters; and an interval between the plasma optical filaments is adjusted by a wavelength of the femtosecond pulse laser and the included angle between the interfering laser beams, and ranges from hundred nanometers to micrometers.

3. The apparatus according to claim 1, wherein the first CCD camera, the first convex lens, the second convex lens, the second CCD camera, the third convex lens, and the fourth convex lens form an imaging device for monitoring a process of laser processing of the microchannel; a telescope system formed by the first convex lens and the second convex lens and a telescope system formed by the third convex lens and the fourth convex lens are arranged in two orthogonal directions of a cross section of an optical axis; the first CCD camera is arranged at a focal point of the second convex lens; and the second CCD camera is arranged at a focal point of the fourth convex lens.

4. The apparatus according to claim 1, wherein the quartz glass is arranged on the three-dimensional electronically controlled displacement platform, a length and number of the optical filaments in the plasma grating are adjusted at a focal point of a converging lens, the three-dimensional electronically controlled displacement platform is coordinately controlled, and a microchannel structure is ablated in the quartz glass; an imaging device is configured to observe a shape of the plasma grating in the quartz glass in real time; and the converging lens is a circular lens, a plano-convex cylindrical lens, a microlens array or a conical lens.

5. The apparatus according to claim 1, wherein a hydrofluoric acid solution in the hydrofluoric acid ultrasonic cell infiltrates the quartz glass by using ultrasound and corrodes a path of laser ablation in the quartz glass to form a microchannel structure, and the microfluidic chip made of the quartz glass is obtained; and the microchannel structure has a three-dimensional distribution on a surface of the quartz glass or within the quartz glass.

* * * * *